United States Patent
Lee et al.

(10) Patent No.: US 8,565,110 B2
(45) Date of Patent: Oct. 22, 2013

(54) APPARATUS AND METHOD FOR RECEIVING DATA IN COMMUNICATION SYSTEM

(75) Inventors: Jae-Ho Lee, Daejeon (KR); Young-Kwon Hahm, Daejeon (KR); Dong-Joon Choi, Daejeon (KR); Soo-In Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 228 days.

(21) Appl. No.: 13/025,639

(22) Filed: Feb. 11, 2011

(65) Prior Publication Data

US 2012/0147763 A1 Jun. 14, 2012

(30) Foreign Application Priority Data

Dec. 9, 2010 (KR) .......................... 10-2010-0125394

(51) Int. Cl.
*H04L 12/26* (2006.01)

(52) U.S. Cl.
USPC ........... 370/252; 370/342; 370/343; 375/260; 375/319; 375/342; 375/360

(58) Field of Classification Search
USPC .......... 370/252, 342, 343; 375/360, 319, 342, 375/260
See application file for complete search history.

(56) References Cited

U.S. PATENT DOCUMENTS

| | | | | |
|---|---|---|---|---|
| 7,924,801 B2* | 4/2011 | Kang et al. | ..................... | 370/343 |
| 2002/0168034 A1* | 11/2002 | Yang et al. | ..................... | 375/342 |
| 2006/0203926 A1* | 9/2006 | Chiodini | ........................ | 375/260 |
| 2008/0080466 A1* | 4/2008 | Kang et al. | ..................... | 370/342 |
| 2009/0285334 A1* | 11/2009 | Birkett et al. | .................. | 375/319 |
| 2010/0075624 A1* | 3/2010 | Shanan | ........................ | 455/253.2 |
| 2010/0316175 A1* | 12/2010 | Zeng et al. | ..................... | 375/360 |

FOREIGN PATENT DOCUMENTS

KR 10-2009-0114034 12/2010

\* cited by examiner

*Primary Examiner* — Albert T Chou
(74) *Attorney, Agent, or Firm* — Staas & Halsey LLP

(57) ABSTRACT

An apparatus for receiving data in a communication system includes: a detection unit configured to calculate power values of a data packet and a ratio of the power values by using a preamble of the data packet in a received signal, and detect the data packet through the calculated ratio of the power values; a control unit configured to calculate a gain compensation value of the detected data packet, and perform an automatic gain control (AGC) on the detected data packet by using the gain compensation value; a compensation unit configured to calculate a DC offset in the received signal, and remove the DC offset from the received signal; and a demodulator configured to demodulate the AGCed data packet.

18 Claims, 8 Drawing Sheets

APPARATUS AND METHOD FOR RECEIVING DATA IN COMMUNICATION SYSTEM

CROSS-REFERENCE TO RELATED APPLICATIONS

The present application claims priority of Korean Patent Application No. 10-2010-0125394, filed on Dec. 9, 2010, which is incorporated herein by reference in its entirety.

BACKGROUND OF THE INVENTION

1. Field of the Invention

Exemplary embodiments of the present invention relate to a communication system; and, more particularly, to an apparatus and method for receiving data by detecting a data packet through an automatic gain control (AGC) and a DC offset removal in a communication system.

2. Description of Related Art

Many studies have been actively conducted to provide users with services having diverse quality of service (QoS) at a high transfer rate in an existing communication system. In such a communication system, methods for normally transmitting and receiving data having diverse QoS through a limited resource at a high rate have been introduced.

In addition, a communication system transmits and receives data in a packet format in order for the above-mentioned data transmission and reception. In particular, a data receiving apparatus detects a packet of data transmitted through a limited resource, and recovers the detected packet. In this way, the data receiving apparatus receives data transmitted from a data transmitting apparatus. As described above, when data is transmitted and received in the packet format through the limited resource, it is necessary to accurately detect the packet in order to improve a data transfer rate. In addition, a communication system needs to perform an AGC upon packet detection in order for more stably normal data transmission and reception. In particular, it is necessary to perform an AGC more accurately in order to improve a data transfer rate.

In the existing communication system, there has been proposed a method which detects intended data or data packets by using statistics at a corresponding frequency band with respect to an intended receive data signal. However, since such a detecting method based on statistics of the received signal significantly reduces the accuracy of a data or packet detection, there is a limitation in stable normal data transmission and reception. In addition, due to the reduction in the accuracy of the packet detection, it is difficult to perform an AGC accurately.

Therefore, there is a need for a method which can stably and normally receive data by detecting data packets exactly through a more accurate AGC and DC offset removal.

SUMMARY OF THE INVENTION

An embodiment of the present invention is directed to an apparatus and method for receiving data in a communication system.

Another embodiment of the present invention is directed to an apparatus and method for receiving data by accurately detecting a packet of data which is transmitted in a packet format in a communication system.

Another embodiment of the present invention is directed to an apparatus and method for receiving data stably and normally by detecting data packets through an AGC and a DC offset removal in a communication system.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

In accordance with an embodiment of the present invention, an apparatus for receiving data in a communication system includes: a detection unit configured to calculate power values of a data packet and a ratio of the power values by using a preamble of the data packet in a received signal, and detect the data packet through the calculated ratio of the power values; a control unit configured to calculate a gain compensation value of the detected data packet, and perform an automatic gain control (AGC) on the detected data packet by using the gain compensation value; a compensation unit configured to calculate a DC offset in the received signal, and remove the DC offset from the received signal; and a demodulator configured to demodulate the AGCed data packet.

In accordance with another embodiment of the present invention, a method for receiving data in a communication system includes: calculating power values of a data packet and a ratio of the power values by using a plurality of sequences which are repetitively included in a preamble of the data packet at a predetermined period in a received signal; detecting the data packet by counting a payload interval of the data packet through the ratio of the power values; calculating a gain compensation value of the detected data packet, and performing an AGC on the detected data packet with the gain compensation value; and demodulating the AGCed data packet.

DESCRIPTION OF SPECIFIC EMBODIMENTS

Figure 1:
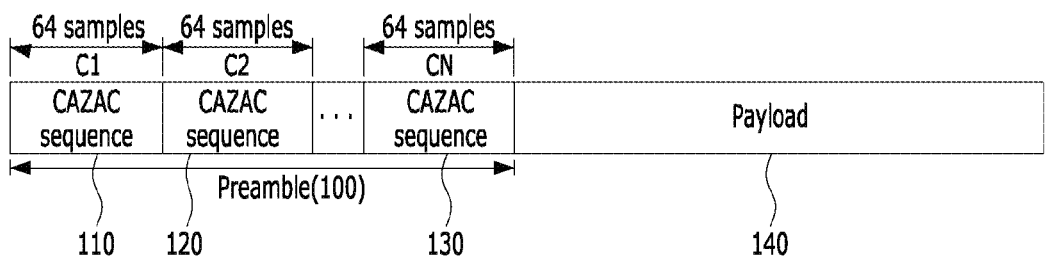
FIG. 1 schematically illustrates a structure of a data packet in a communication system in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The present invention proposes an apparatus and method which receive data by detecting a packet of data which is transmitted in a packet format through a limited resource in a communication system. Embodiments of the present invention provide an apparatus and method which receive data having diverse QoS through a limited resource normally and stably at a high speed, upon data transmission and reception for providing users with services having diverse QoS at a high transfer rate.

In addition, embodiments of the present invention provide an apparatus and method which detect a packet of data transmitted through a limited resource, recover the detected packet, and receive data transmitted from a data transmitting apparatus. The packet includes a preamble having periodicity and a payload. In embodiments of the present invention, the preamble having periodicity is used to detect a packet accurately in order to improve a transfer rate of data which is transmitted and received through a limited resource in a packet format. In embodiments of the present invention, the accurate packet detection using the preamble prevents malfunction of a demodulator which recovers or demodulates data. Hence, data is received stably and normally and a data transfer rate is improved.

Furthermore, in embodiments of the present invention, an AGC is performed using the intensity (e.g., power) of a received signal corresponding to the packet which is accurately detected by using the preamble. In particular, an accurate ADC is performed by calculating a DC offset during an interval where no packet exists and compensating (i.e., removing) the DC offset. In embodiments of the present invention, since the AGC is performed using the intensity of the received signal corresponding to the detected packet, a quantity of additional hardware for the AGC is reduced and data is received stably and normally through a more accurate AGC, thereby improving a data transfer rate. Hereinafter, a data packet transmitted and received through a limited resource in a communication system in accordance with an embodiment of the present invention will be described in detail with reference to FIG. 1.

FIG. 1 schematically illustrates a structure of a data packet in a communication system in accordance with an embodiment of the present invention.

Referring to FIG. 1, the data packet includes a preamble 100 having periodicity and a payload 140. The preamble includes a plurality of Constant Amplitude Zero Autocorrelation (CAZAC) sequences, for example, C1 100, C2 120, and CN 130, as code sequences in order to have periodicity. Each of the C1 100, C2 120, and CN 130 has a plurality of samples, for example, 64 samples.

The plurality of CAZAC sequences, that is, C1 100, C2 120, and C3 130, included in the preamble 100 of the data packet may be expressed as Equation 1 below. As expressed in Equations 1 and 2 below, each of the CAZAC sequences has a complex number consisting of a real number and an imaginary number, and a symbol length thereof is 16. In addition, as described above, the preamble 100 of the data packet has periodicity according to the repetitive use of the plurality of CAZAC sequences.

$$REAL(CAZAC)=(1,1,1,1,1,-1,-1,1,1,-1,1,-1,1,1,-1,-1)$$ Eq. 1

$$IMAG(CAZAC)=(1,1,1,1,1,-1,-1,1,1,-1,1,-1,1,1,-1,-1)$$ Eq. 2

As described above, the communication system in accordance with the embodiment of the present invention transmits and receives the data packet including the preamble 100 and the payload 140, and a receiving apparatus of the communication system receives data by detecting the data packet transmitted through a limited resource and recovering the detected data packet. Hereinafter, an apparatus for transmitting and receiving data through a limited resource in a packet format in a communication system in accordance with an embodiment of the present invention will be described in more detail with reference to FIG. 2.

Figure 2:
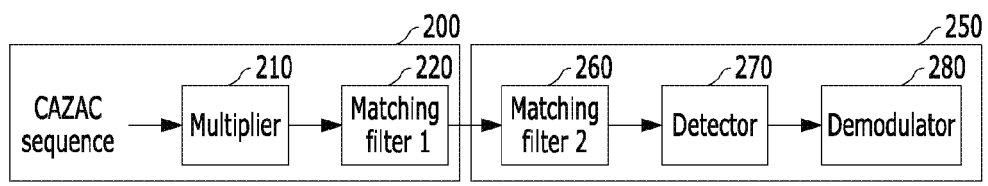
FIG. 2 schematically illustrates the architecture of a data transmitting/receiving apparatus in a communication system in accordance with an embodiment of the present invention.

FIG. 2 schematically illustrates the architecture of a data transmitting/receiving apparatus in a communication system in accordance with an embodiment of the present invention. Specifically, FIG. 2 schematically illustrates the architecture of the apparatus for transmitting and receiving the data packet of FIG. 1 through a limited resource.

Referring to FIG. 2, the communication system includes a transmitter 200 and a receiver 250. The transmitter 200 transmits a data packet including a preamble and a payload. The preamble has periodicity according to the repetitive use of the incoming CAZAC sequences. The receiver 250 receives data by detecting the data packet using the preamble of the data packet transmitted from the transmitter 200.

The transmitter 200 includes a multiplier 210 and a first matching filter 220. The multiplier 210 multiplies the CAZAC sequence of the data packet, which is to be transmitted, by $1/\sqrt{2}$. The first matching filter 220 amplifies a signal of the data packet to be transmitted, and transmits the amplified signal through a limited resource. The receiver 250 includes a second matching filter 260, a detector 270, and a demodulator 280. The second matching filter 260 amplifies the signal of the data packet transmitted through the limited resource. The detector 270 detects the data packet from the received signal. The demodulator 280 receives desired data by recovering the detected data packet, that is, demodulating the data.

The detector 270 detects the data packet from the received signal by using the preamble, which is included in the data packet and has periodicity. As the data packet is detected by using the preamble, the data packet is detected accurately, and thus, the data is received more stably and normally. In addition, the detector 270 performs an AGC by using the intensity of the received signal corresponding to the data packet which is detected accurately by using the preamble. In particular, the ADC is performed more accurately by calculating a DC offset during an interval where no packet exists and compensating (i.e., removing) the DC offset. Hereinafter, the detector 270 of the receiver 250 in the communication system in accordance with the embodiment of the present invention will be described in more detail with reference to FIG. 3.

Figure 3:
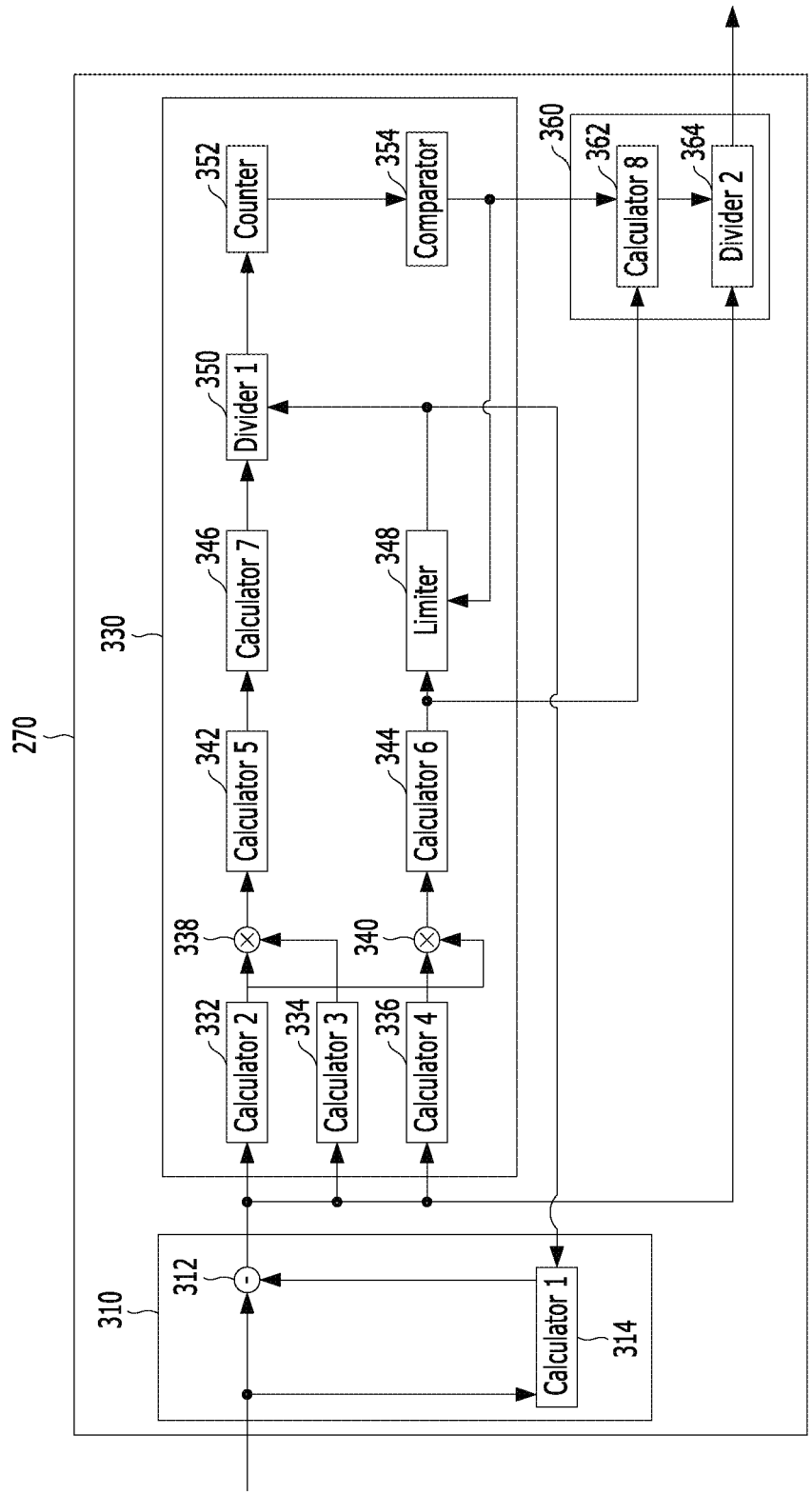
FIG. 3 schematically illustrates the architecture of a detector of a receiver in the communication system in accordance with the embodiment of the present invention.

FIG. 3 schematically illustrates the architecture of the detector of the receiver in the communication system in accordance with the embodiment of the present invention.

Referring to FIG. 3, the detector 270 includes a compensation unit 310, a detection unit 330, and a control unit 360. The detection unit 330 detects the data packet by using the preamble in the received signal corresponding to the data packet transmitted through the limited resource in the packet format. The control unit 360 performs the AGC by using the intensity of the received signal corresponding to the detected data packet. The compensation unit 310 calculates the DC offset during the interval where no data packet exists and compensates the DC offset.

The compensation unit 310 includes a first calculator 314 and a remover 312. The first calculator 314 calculates the DC offset in the received signal during the interval where no data packet is received. The remover 312 removes the DC offset from the received signal by compensating the calculated DC offset. The first calculator 314 recognizes a data packet reception end time point and an interval where no data packet is received, by using an output of a limiter 348 included in the control unit 360. Through the recognition of the interval where no data packet is received, the first calculator 314 calculates the DC offset in the received signal during the interval where no data packet exists.

The detection unit 330 includes a second calculator 332, a third calculator 334, and a fourth calculator 336. As each CAZAC sequence of the preamble included in the data packet and having periodicity has a complex number, the second calculator 332 calculates complex numbers r1(n) of the CAZAC sequences of the preamble in order for the detection of the data packet. The third calculator 334 calculates complex numbers r1(n−N) of the CAZAC sequences of a previous period in the CAZAC sequences of the preamble having periodicity at a predetermined period N. The fourth calculator 336 calculates complex conjugate numbers r1*(n) with respect to the complex numbers of the CAZAC sequences of the preamble. The third calculator 334 calculates the complex numbers r1(n−N) of the CAZAC sequences of a previous period of the CAZAC sequences corresponding to the complex numbers r1(n) calculated by the second calculator 332, that is, prior to one period of the CAZAC sequences.

In addition, the detection unit 330 includes a first multiplier 338 and a second multiplier 340. The first multiplier 338 multiplies the complex numbers r1(n) of the CAZAC sequences by the complex numbers r1(n−N) of the CAZAC sequences of the previous period. The second multiplier 340 multiplies the complex numbers r1(n) of the CAZAC sequences by the complex conjugate numbers r1*(n) thereof. Furthermore, the detection unit 330 includes a fifth calculator 342 and a sixth calculator 344. The fifth calculator 342 calculates a mean value of the output r1(n)·r1(n−N) of the multiplier 338 with respect to all samples of the CAZAC sequences of the preamble having periodicity. The sixth calculator 344 calculates a mean value of the output r1*(n)·r1(n) of the multiplier 340 with respect to all samples of the CAZAC sequences of the preamble having periodicity. The fifth calculator 342 calculates a mean value $$\sum_{n=k}^{n=N+k} r1(n) \cdot r1(n-N)$$

of r1(n)·r1(n−N) by cumulatively calculating all samples of the CAZAC sequences of one period in the CAZAC sequences of the preamble having the periodicity. The sixth calculator 344 calculates a mean value $$\sum_{n=k}^{n=N+k} r1^*(n) \cdot r1(n)$$

of r1*(n)·r1(n) by cumulatively calculating all samples of the CAZAC sequences of one period in the CAZAC sequences of the preamble having the periodicity.

Moreover, the detection unit 330 includes a seventh calculator 346 which calculates a magnitude $$\left| \sum_{n=k}^{n=N+k} r1(n) \cdot r1(n-N) \right|$$

of the mean value $$\sum_{n=k}^{n=N+k} r1(n) \cdot r1(n-N)$$

of the CAZAC sequences in one period of the product r1(n)·r1(n−N) of the complex number r1(n) of the CAZAC sequences and the complex number r1(n−N) of the CAZAC sequences of the previous period. The seventh calculator 346 calculates power U(k) of the data packet received in one period as the magnitude of the CAZAC sequences of one period in the CAZAC sequences of the preamble having periodicity, that is, the magnitude of the received signal in one period of the preamble having periodicity, or calculates the intensity of the received signal corresponding to the data packet.

In addition, the detection unit 330 includes a limiter 348 which calculates and sets the magnitude of the mean value $$\sum_{n=k}^{n=N+k} r1^*(n) \cdot r1(n)$$

of the product r1*(n)−r1(n) of the complex number r1(n) of the CAZAC sequences and the complex conjugate number r1*(n) thereof. The limiter 348 calculates power D(k) of the data packet received in one period as the magnitude of the CAZAC sequences of one period in the CAZAC sequences of the preamble having the periodicity, that is, the magnitude of the received signal in one period of the preamble having periodicity, or calculates the intensity of the received signal corresponding to the data packet. Using the power D(k) of the data packet which is calculated by the limiter 348, the compensation unit 310 recognizes a data packet reception end time point and an interval where no data packet is received. Through the recognition of the interval where no data packet is received, the compensation unit 310 calculates the DC offset in the received signal during the interval where no data packet exists.

The detection unit 330 includes a first divider 350 which calculates a power ratio P(k) of the data packet. The first divider 350 calculates a ratio P(k) of the power U(k) of the received data packet as the magnitude of the CAZAC sequences of the preamble having periodicity, that is, the magnitude of the received signal, to the power D(k) of the received data packet as the magnitude of the CAZAC sequences of the preamble of one period, that is, the magnitude of the received signal of one period. The power ratio P(k) of the data packet calculated by the first divider 350 may be expressed as Equation 3 below.

$$P(k) = \frac{U(k)}{D(k)} = \frac{\left|\sum_{n=k}^{n=N+k} r1(n) \cdot r1(n-N)\right|}{\sum_{n=k}^{n=N+k} r1^*(n) \cdot r1(n)} \qquad \text{Eq. 3}$$

$$k = 0, 1, 2, \ldots, m$$

In Equation 3 above, k represents sample indexes of the CAZAC sequences of the preamble included in the data packet, and N represents one period of the preamble having periodicity.

In addition, the detection unit 330 includes a counter 352 which counts the payload interval of the data packet according to the calculated power ratio P(k) of the data packet. As the data packet is received from an arbitrary interval, the demodulator 280 may malfunction when it demodulates the data packet received from the payload interval as the arbitrary interval in order to prevent the recovery error of the data packet. To prevent the malfunction of the demodulator 280, the counter 352 compares the power ratio P(k) of the data packet with a first preset threshold value and counts the payload interval of the data packet according to the comparison result. For example, the counter 352 outputs a count value obtained by counting an interval in which the power ratio P(k) of the data packet is greater than the first threshold value, and initializes the count value when the power ratio P(k) of the data packet is less than the first threshold value.

The detection unit 330 includes a comparator 354 which compares the count value of the counter 352 with a second preset threshold value and outputs a data packet detection signal. When the count value is greater than the second threshold value, the data packet is detected, that is, the arbitrary interval where the data packet is received exceeds the preset interval. Thus, the detection unit 330 detects the received data packet, and the comparator 354 outputs a detection signal to the control unit 360, wherein the detection signal indicates the data packet detection of the detection unit 330.

Figure 4:
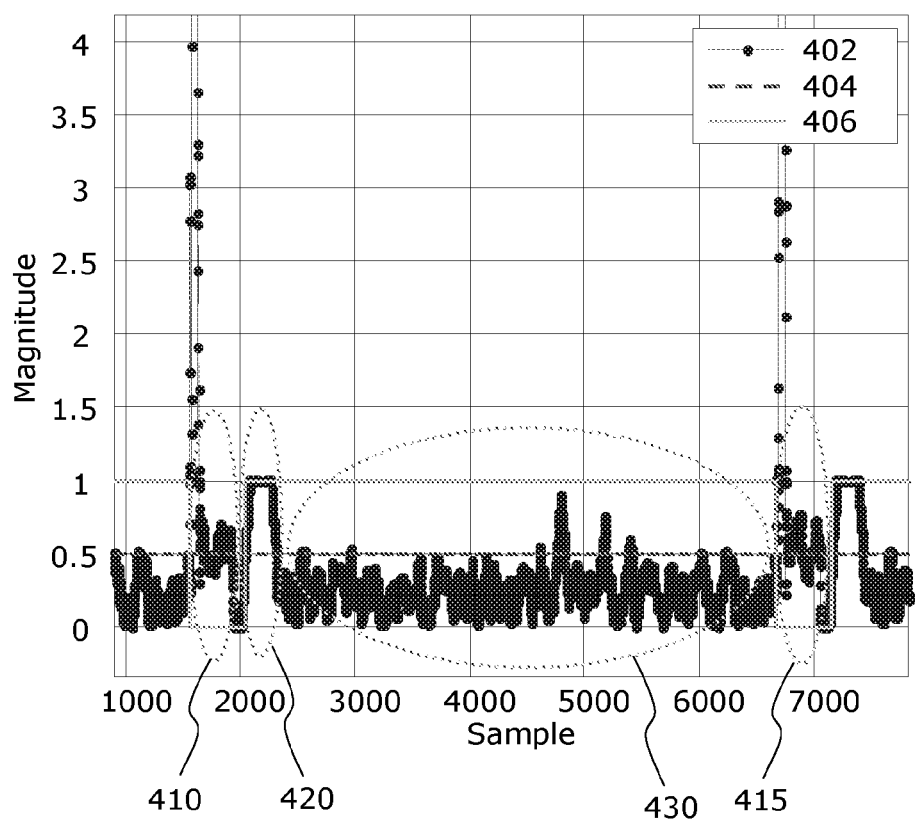
FIGS. 4 and 5 illustrate signals upon data packet detection in the communication system in accordance with the embodiment of the present invention.
Figure 5:
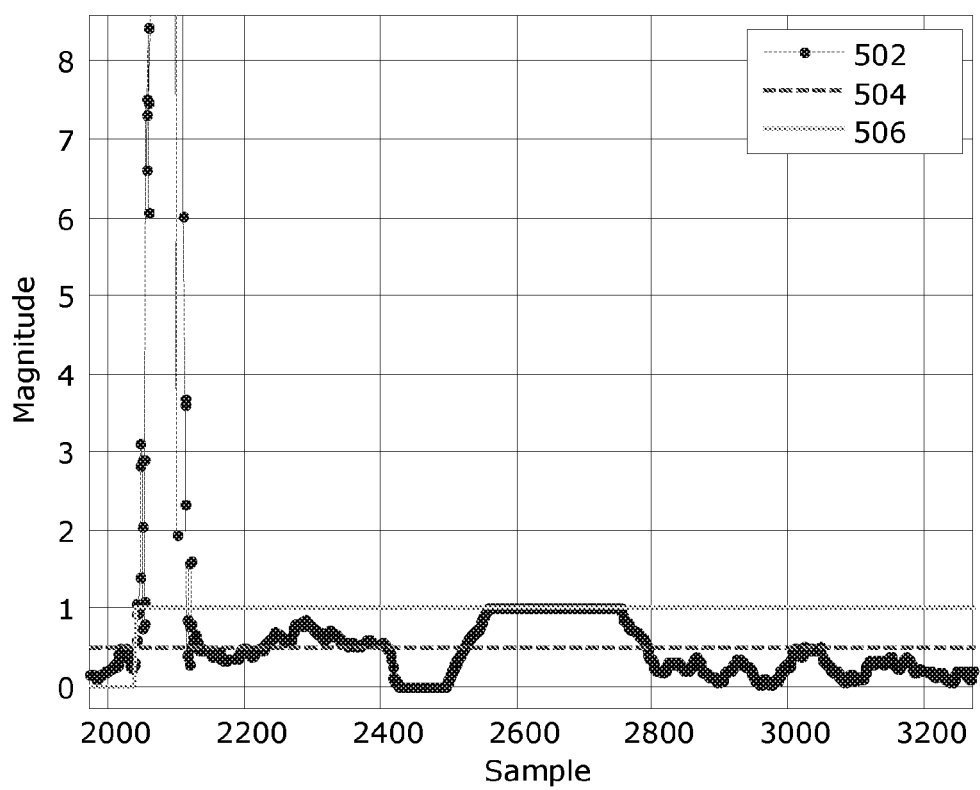

The detection unit 330 detects the data packet through the CAZAC sequences of the preamble included in the data packet. In particular, the detection unit 330 calculates the power ratio P(k) of the data packet from the CAZAC sequences and detects the data packet accurately through the comparison between the power ratio P(k) of the data packet and the threshold values. That is, as illustrated in FIGS. 4 and 5, the detection unit 330 compares the power ratios P(k) 402 and 502 of the data packet with the first threshold values 404 and 504, and outputs the data packet detection signals 406 and 506 to the control unit 360. FIGS. 4 and 5 illustrate the magnitude of each signal in the samples upon the data packet detection of the communication system in accordance with the embodiment of the present invention.

Referring to FIGS. 4 and 5, as the data packet is detected through the CAZAC sequences of the preamble included in the data packet as described above, the power ratios P(k) 402 and 502 of the data packet are calculated with respect to the samples of the CAZAC sequences, and the intervals 410 and 415 where no packet exists, the preamble interval 420, and the payload interval 430 are confirmed according to the magnitude of the power ratios P(k) 402 and 502 of the data packet and the magnitude of the first threshold values 404 and 504. The data packet detection signals 406 and 506 are outputted to the control unit 360. When the data packet detection signals 406 and 506 change from a low level to a high level, for example, from 0 to 1 in magnitude, the detection unit 330 indicates the data packet detection by using the CAZAC sequences of the preamble included in the data packet, and outputs the detection signals 406 and 506 to the control unit 360.

In the interval 415 where the reception of the data packet is ended, the power value D(k) of the received data packet as the magnitude of the received signal in one period outputted from the limiter 348 of the detection unit 330 may be very small. When the power value D(k) of the received data packet as the magnitude of the received signal in one period, which is the output of the limiter 348, is very small, the power ratio P(k) 402 of the data packet, which is the output of the divider 350, may be very large. As a result, malfunction may occur so that the counter 352 counts as the intervals where data packet exists because the power ratio P(k) 402 of the data packet is greater than the first threshold value, although no packet exists in those intervals 410 and 415.

Therefore, in order to prevent such a malfunction, the limiter 348 compares the power value D(k) of the received data packet as the magnitude of the received signal in one period with a third threshold value. When the power value D(k) of the data packet is smaller than the third threshold value, the power value D(k) of the data packet is changed to 1. At a time point when the detection signals 406 and 506 change from a low level to a high level, that is, when the detection signals 406 and 506 indicate the data packet detection, the limiter 348 updates the third threshold value by multiplying the power value D(k) of the data packet by the initially set third threshold value. The update of the third threshold value may be expressed as Equation 4 below.

$$\text{thr3}_n = \text{thr3}_{init} * D_L \qquad \text{Eq. 4}$$

In Equation 4 above, $D_L$ represents the power value D(k) of the received data packet as the magnitude of the received signal in one period at a time point when the detection signals 406 and 506 indicate the data packet detection, $\text{thr3}_{init}$ represents the initially set third threshold value, and $\text{thr3}_n$ represents the updated third threshold value.

In addition, the case in which the limiter 348 changes the power value D(k) of the data packet to 1 represents the intervals 410 and 415 in which no data packet exists. Thus, the comparator 354 changes the detection signals 406 and 506 from a high level to a low level, that is, changes the magnitude of the detection signals 406 and 506 from 0 to 1, and outputs them to the control unit 360. As a result, the detection unit 330 detects the entire data packet by notifying the data packet reception end time point to the control unit 360.

Furthermore, since the limiter 348 changes the power value D(k) of the data packet to 1 in the intervals 410 and 415 where no data packet exists, the compensation unit 310 calculates a DC offset and compensates or removes the DC offset in the intervals 410 and 415 where no data packet exists, that is, when the limiter 348 changes the power value D(k) of the data packet to 1. The first calculator 314 of the compensation unit 310 calculates a mean value of the DC offset in the received signal during the intervals 410 and 415 where no data packet exists, and the remover 312 removes the DC offset by subtracting the calculated mean value of the DC offset from the received signal.

The control unit 360 includes an eighth calculator 362 and a second divider 364. The eighth calculator 362 calculates a gain compensation value in the interval where the data packet is detected. The second divider 364 compensates the gain compensation value in the received signal where the data packet is received. In the interval where the data packet is detected, that is, when the detection signal changed from a low level to a high level is received from the detection unit 330, the eighth calculator 362 calculates the gain compensation value by taking the square root of the power value D(k) of the received data packet as the magnitude of the received signal in one period at a time point when the detection signal changes from a low level to a high level. That is, the eighth calculator 362 calculates the gain compensation value by calculating the square root of the mean value $$\sum_{n=k}^{n=N+k} r1^*(n) \cdot r1(n)$$

of the product r1*(n)·r1(n) of the complex numbers r1(n) and the complex conjugate numbers r1*(n) of the CAZAC sequences of the preamble used for detecting the data packet.

The second divider 364 multiplies the received signal by a reciprocal of the gain compensation value calculated by the eighth calculator 362. Accordingly, the second divider 364 compensates the received data packet with the gain compensation value and outputs the AGCed data packet to the demodulator 280. In other words, when the detection unit 330 detects the data packet, the control unit 360 calculates the gain compensation value by using the mean value of the CAZAC sequences of the preamble included in the detected data packet, that is, the power value D(k) of the data packet, and performs an AGC by compensating the detected data packet with the calculated gain compensation value. In addition, the control unit 360 performs a more accurate AGC because the compensation unit 310 removes the DC offset in the interval where no data packet exists. The control unit 360 outputs the AGCed data packet to the demodulator 280, and the demodulator 280 demodulates the data packet.

Figure 6:
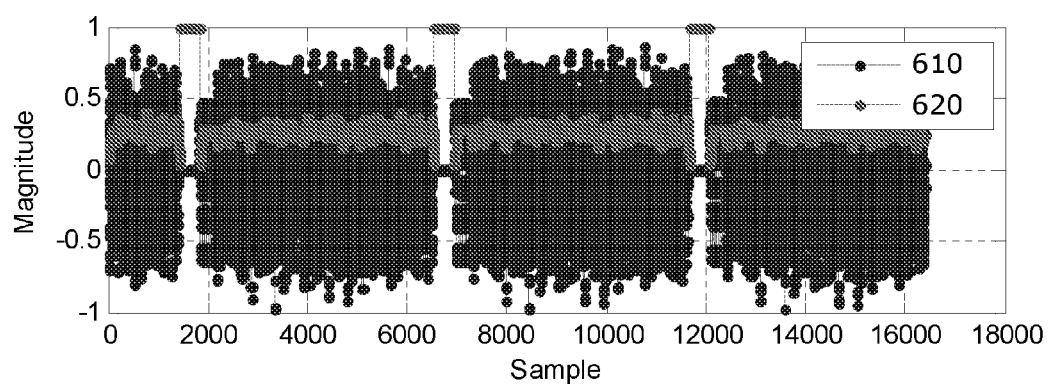
FIGS. 6 to 9 illustrate signals upon AGC in the communication system in accordance with the embodiment of the present invention.
Figure 7:
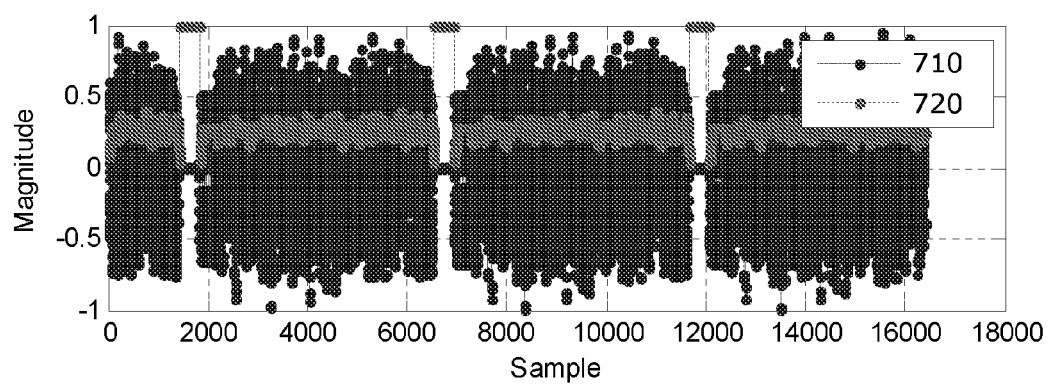
Figure 8:
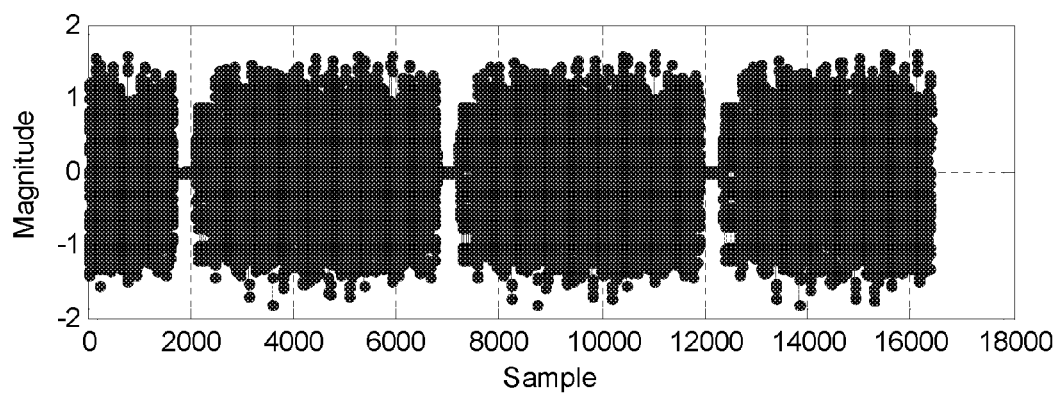
Figure 9:
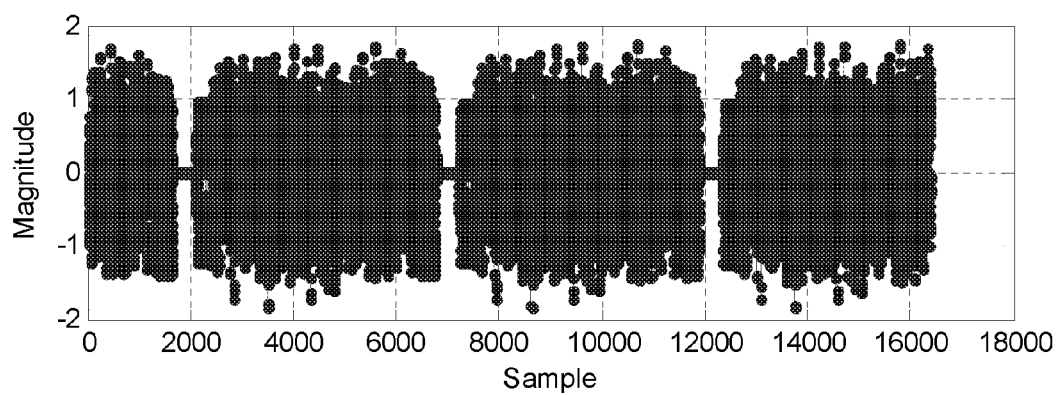

The signals of the data packet according to the AGC of the control unit 360 are illustrated in FIGS. 6 to 9. FIGS. 6 to 9 illustrate the magnitudes of the signals of the samples upon the AGC in the communication system in accordance with the embodiment of the present invention. Specifically, FIGS. 6 and 7 illustrate the signals inputted to the control unit 360, that is, the received signals 610 and 710 of the data packet prior to the AGC, and the power values D(k) 620 and 720 of the data packet. In other words, FIG. 6 illustrates the I signal 610 of the data packet and the power value D(k) 620 of the data packet, and FIG. 7 illustrates the Q signal 710 of the data packet and the power value D(k) 720 of the data packet. FIG. 8 illustrates the I signal of the data packet to which the control unit 360 performs the AGC, and FIG. 9 illustrates the Q signal of the data packet to which the control unit 360 performs the AGC.

Figure 10:
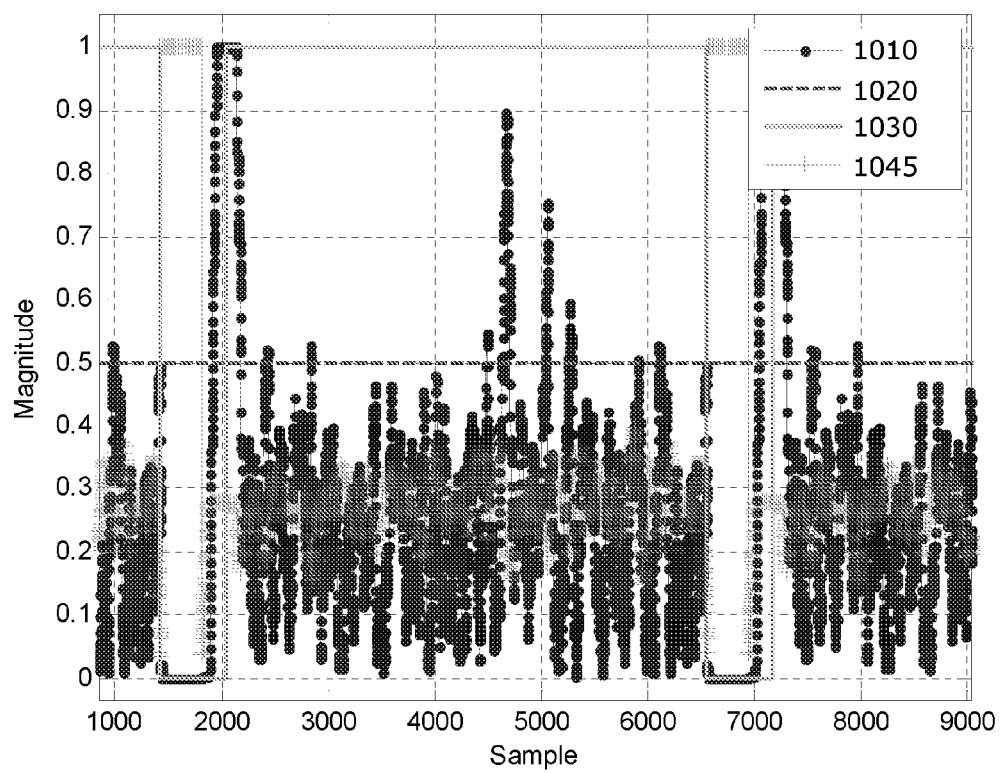
FIG. 10 illustrates signals upon data packet detection, AGC, and DC offset removal of the detector in the communication system in accordance with the embodiment of the present invention.

In the communication system in accordance with the embodiment of the present invention, the detector detects the data packet with the preamble having periodicity by calculating the power values of the CAZAC sequences of the preamble, and performs the AGC by using the detected power value of the data packet, that is, the intensity of the data packet. The receiver removes the DC offset in the interval where no data packet exists. Thus, the data packet is demodulated more stably and normally. The signal according to the data packet detection, the AGC and the DC offset removal of the detector is illustrated in FIG. 10. FIG. 10 illustrates the signal upon the data packet detection, the AGC, and the DC offset removal of the detector in the communication system in accordance with the embodiment of the present invention. That is, as illustrated in FIG. 10, in order for the data packet detection, the AGC, and the DC offset removal, the detector detects the data packet by comparing the first threshold value 1020 with the power ratio P(k) 1010 of the data packet with respect to the samples of the CAZAC sequences, and performs the AGC and removes the DC offset according to the detection signal 1030 and the power value D(k) 1045 of the data packet. Hereinafter, the data packet detection, the AGC, and the DC offset of the detector in the communication system in accordance with the embodiment of the present invention will be described in more detail with reference to FIG. 11.

Figure 11:
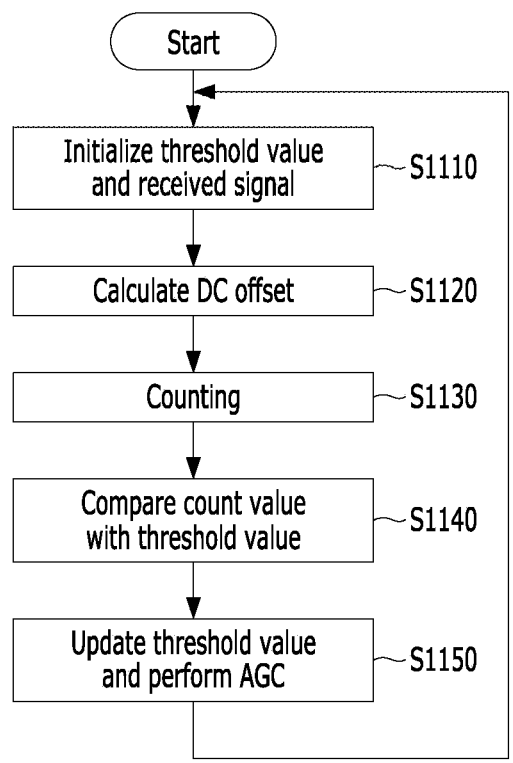
FIG. 11 schematically illustrates the operation of the detector in the communication system in accordance with the embodiment of the present invention.

FIG. 11 schematically illustrates the operation of the detector in the communication system in accordance with the embodiment of the present invention.

Referring to FIG. 11, at step S1110, the detector initializes a threshold value for detection of a data packet, which is transmitted through a limited resource, and a received signal corresponding to the data packet. As described above, the data packet includes a preamble which has periodicity according to the repetitive use of a plurality of CAZAC sequences. At step S1120, a DC offset is calculated in the received signal during an interval where no data packet exists, and the DC offset is removed from the received signal.

At step S1130, power values U(k) and D(k) of the data packet are calculated using the CAZAC sequences of the preamble included in the data packet, and a payload interval of the data packet is counted by comparing the first threshold value, which is previously set through the initialization, with the ratio P(k) of the calculated power values U(k) and D(k). Since the power values U(k) and D(k) of the data packet and the power ratio P(k) have been described above in detail, a further description thereof will be omitted.

At step S1140, a data packet detection signal is outputted by comparing the count value of the payload interval of the data packet with a second threshold value, which is previously set through the initialization. At step S1150, the initially set threshold value is updated in order to prevent malfunction of the counting operation for the data packet detection, and the AGC is performed on the detected data packet by using the power value D(k) of the data packet according to the detection signal of the data packet. The AGCed data packet is outputted to a demodulator. Thus, the data packet can be demodulated more stably and normally. Since the AGC has been described above in more detail, a further description thereof will be omitted. In addition, the interval where no data packet exists is confirmed through the power value D(k) of the data packet, and the DC offset is calculated and removed at the step S1120 during the interval where no data packet exists.

In the communication system in accordance with the embodiment of the present invention, the receiver detects the data packet by using the preamble which has periodicity according to the periodic use of a plurality of CAZAC sequences. In other words, the receiver detects the data packet more accurately by calculating the power values U(k) and D(k) of the data packet and the power ratio P(k) thereof by using the CAZAC sequences. The receiver performs the AGC on the data packet by using the intensity of the signal corresponding to the data packet, that is, the power value D(k) of the data packet, and removes the DC offset by using the power value D(k) of the data packet during the interval where no data packet exists. Therefore, the data packet is demodulated more accurately and the data is received more stably and normally.

In accordance with the exemplary embodiments of the present invention, the communication system can detect the data packet accurately by using the preamble having periodicity, perform the AGC accurately by using the intensity of the received signal corresponding to the detected data packet, reduce the quantity of additional hardware for the AGC, and calculate and remove the DC offset during the interval where no data packet exists, whereby the AGC can be performed more accurately. Accordingly, the data can be received more stably and normally, thereby improving the data transfer rate through the limited resource.

While the present invention has been described with respect to the specific embodiments, it will be apparent to those skilled in the art that various changes and modifications may be made without departing from the spirit and scope of the invention as defined in the following claims.

What is claimed is:

1. An apparatus for receiving data in a communication system, the apparatus comprising:
    a detection unit configured to detect a data packet based on a ratio of power values of the data packet calculated with a preamble of the data packet in a received signal;
    a control unit configured to perform an automatic gain control (AGC) on the detected data packet with a gain compensation value of the detected data packet;
    a compensation unit configured to remove a DC offset from the received signal, the DC offset being in an interval in the received signal where no data packet exists; and
    a demodulator configured to demodulate the AGCed data packet,
    wherein the preamble includes periodically repeated sequences, and the detection unit identifies an end of the data packet by comparing a first preset threshold value with a first power value of the data packet calculated with the sequence of a period of the preamble.

2. The apparatus of claim 1, wherein the sequences are constant amplitude zero autocorrelation (CAZAC) sequences.

3. The apparatus of claim 1, wherein the power value of the data packet is a mean value of complex numbers of the sequences.

4. The apparatus of claim 1, wherein the detection unit detects the data packet by counting a payload interval of the data packet based on the ratio of power values of the data packet.

5. The apparatus of claim 1, wherein the ratio of the power values of the data packet is a ratio of a second power value to the first power value, the second power value being calculated with the sequences of the period and a previous period of the preamble.

6. The apparatus of claim 4, wherein the detection unit counts the payload interval of the packet data by comparing the ratio of the power values with a second preset threshold value.

7. The apparatus of claim 1, wherein the gain compensation value is a square root of the first power value.

8. The apparatus of claim 1, wherein the interval in the received signal where no data packet exists is identified based on the first power value.

9. The apparatus of claim 1, wherein the detection unit updates the first preset threshold value with the first power at the time point of the end of the data packet.

10. A method for receiving data in a communication system, the method comprising:
    detecting, by a processor, a data packet based on a ratio of power values of the data packet calculated with a preamble of the data packet in a received signal;
    performing, by the processor, an automatic gain control (AGC) on the detected data packet with a gain compensation value of the detected data packet;
    removing, by the processor, a DC offset from the received signal, the DC offset being in an interval in the received signal where no data packet exists; and
    demodulating, by the processor, the AGCed data packet,
    wherein the preamble includes periodically repeated sequences, and an end of the data packet is identified based on comparison of a first preset threshold value with a first power value of the data packet calculated with the sequence of a period of the preamble.

11. The method of claim 10, wherein
    the ratio of the power values of the data packet is a ratio of a second power value to the first power value, the second power value being calculated with the sequences of the period and a previous period of the preamble.

12. The method of claim 10, wherein the power value of the data packet is a mean value of complex numbers of the sequences.

13. The method of claim 10, wherein said detecting the data packet
    comparing the ratio of the power values with a second preset threshold value;
    counting a payload interval of the packet data based on the comparison of the ratio of the power values with the second preset threshold value; and
    detects the data packet based on the count of the payload interval of the packet data.

14. The method of claim 10, wherein
    the gain compensation value is a square root of the first power value.

15. The method of claim 10,
    wherein the interval in the received signal where no data packet exists is identified based on the first power value.

16. The method of claim 10, wherein said detecting the data packet comprises:
    updating the first preset threshold value with the first power value at the time point of the end of the data packet.

17. An apparatus for receiving data in a communication system, the apparatus comprising:
    a detection unit configured to detect a data packet based on a ratio of power values of the data packet calculated with a preamble of the data packet in a received signal;
    a control unit configured to perform an automatic gain control (AGC) on the detected data packet with a gain compensation value of the detected data packet;
    a compensation unit configured to remove a DC offset from the received signal, the DC offset being in an interval in the received signal where no data packet exists; and
    a demodulator configured to demodulate the AGCed data packet, wherein
    the preamble includes periodically repeated sequences, and
    the interval in the received signal where no data packet exists is identified based on a first power value of the data packet calculated with the sequence of a period of the preamble.

18. A method for receiving data in a communication system, the method comprising:
    detecting, by a processor, a data packet based on a ratio of power values of the data packet calculated with a preamble of the data packet in a received signal;
    performing, by the processor, an automatic gain control (AGC) on the detected data packet with a gain compensation value of the detected data packet;
    removing, by the processor, a DC offset from the received signal, the DC offset being in an interval in the received signal where no data packet exists; and
    demodulating, by the processor, the AGCed data packet, wherein
    the preamble includes periodically repeated sequences, and
    the interval in the received signal where no data packet exists is identified based on a first power value of the data packet calculated with the sequence of a period of the preamble.

* * * * *